United States Patent [19]

Reichert et al.

[11] Patent Number: 4,888,301

[45] Date of Patent: Dec. 19, 1989

[54] METHOD FOR GENERATING A SUNKEN OXIDE

[75] Inventors: Hansjöerg Reichert; Ludwig Scharf; Heidemarie Goedecke, all of Munich; Herbert Weidlcih, Sauerlach, all of Fed. Rep. of Germany

[73] Assignee: Siemens Aktiengesellschaft, Berlin and Munich, Fed. Rep. of Germany

[21] Appl. No.: 245,853

[22] Filed: Sep. 16, 1988

[30] Foreign Application Priority Data

Sep. 30, 1987 [DE] Fed. Rep. of Germany ....... 3733020
Jul. 29, 1988 [DE] Fed. Rep. of Germany ....... 3825894

[51] Int. Cl.[4] .......................................... H01L 21/76
[52] U.S. Cl. .......................................... 437/72; 357/49
[58] Field of Search .......................................... 437/69, 72

[56] References Cited

U.S. PATENT DOCUMENTS

Re. 31,506  1/1984  Ogive et al. .......................... 437/72
4,044,454   8/1977  Magdo .................................. 156/649

FOREIGN PATENT DOCUMENTS 55-75234   6/1980  Japan ..................................... 437/72
57-49251   3/1982  Japan ..................................... 437/72
57-199234  12/1982 Japan ..................................... 437/72
58-184739  10/1983 Japan ..................................... 437/72
59-2184    1/1984  Japan ..................................... 437/72

Primary Examiner—Olik Chaudhuri
Attorney, Agent, or Firm—John Francis Moran

[57] ABSTRACT

A method for producing a recessed oxide allows the fabrication of large bonding pads with small capacitance. These bonding pads on simultaneously thick oxide on the semiconductor surface enable contact exposure with good image formation of fine structures on the surface of a transistor. With a protective layer (2), a region (S1) of a semiconductor surface (1) is covered. The area of the semiconductor surface (1) uncovered with the protective layer (2) is etched. Subsequently, an oxide (3) of desired thickness (b) is deposited. With a second phototechnological step the deposited oxide (3) is etched with a structure (S2). Thermal oxidation follows with growth of a hermetic oxide layer (4) the thickness (c) of which is small relative to the thickness (b) of the deposited oxide layer (3). The thermic oxide layer (4) is structured to form the desired geometry.

3 Claims, 4 Drawing Sheets

METHOD FOR GENERATING A SUNKEN OXIDE

BACKGROUND OF THE INVENTION

The invention generally relates to semiconductor device fabrication and, it relates, more particularly, to a method for producing a recessed or sunken oxide in semiconductor device processes.

In bipolar high-frequency transistors of silicon semiconductor material, the capacitance of the bonding pads reduces the effective high-frequency response of the bipolar transistors. In order to decrease the capacitance of the connecting pads, either the bonding pads must be kept small which hinders automatic assembly of the bipolar high-frequency transistor chips when mounting these chips in the housing of these bipolar high-frequency transistors; or the oxide which lies on the semiconductor surface of the bipolar transistors between a bonding pad, for example of an emitter or a base and the collector, can be made thick which, however, in particular in the utilization of contact exposure for structuring the oxide on the semiconductor surface, makes creating an image of fine structures impossible.

Until now in bipolar high-frequency transistors of silicon, primarily small bonding pads were fabricated since a thickening of the oxide on the semiconductor surface produces a depression of the base basin which interferes, in particular in contact exposures for structuring the oxide. In order to remedy this interference, the oxide could be sunk on the semiconductor surface. Methods used up to now for sinking the oxide have either had a negative influence on other high-frequency parameters, for example the LOCOS technology, or they are technologically very complex, for example generating an oxide on the semiconductor surface of porous silicon.

SUMMARY OF THE INVENTION

An object of the present invention is to provide a method in the process of semiconductor device fabrication which permits fabricating large bonding pads with small capacitance of these bonding pads with simultaneously thick oxide on the semiconductor surface with simultaneously good image formation of fine structures on the surface of the transistor in particular also using contact exposure.

Advantages and implementations of the invention are presented and described in the specification and the drawing.

The surface of the oxide deposited on the semiconductor surface can be located above or below the zero line. This means that the surface of the oxide deposited on the semiconductor surface may project beyond the upper edge of the non-oxidized region (S3) or it can lie lower than the upper edge of the non-oxidized region (S3).

An oxide deposited on the semiconductor surface can be sunken below the zero line. In contrast, without additional measures, a LOCOS oxide may not be sunken below the zero line. Consequently, a LOCOS oxide cannot be sunk so far that image formation of fine structures is not possible, in particular when using contact exposure.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

FIGS. 1 to 6 illustrate a simple method for sinking a thick oxide so that it becomes possible to work with large contact bonding pads.

In accordance with FIG. 1 a given region S1 of a semiconductor surface 1 of silicon semiconductor material is covered with a protective layer 2, which region is larger than the base region S3 desired later. The protective layer 2 may comprise, for example, of nitride.

Figure 2:
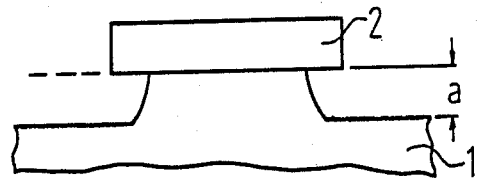
Figure 3:
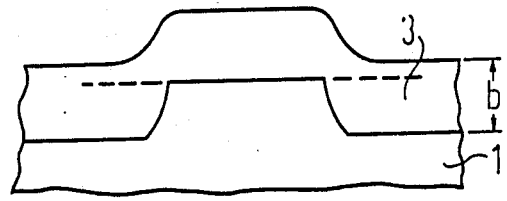

The area of the semiconductor surface 1 not protected by the protective layer 2 is etched until a depression of depth a is created which depth a has nearly the height b of the later wanted oxide layer 3 (depth a should be smaller than the thickness of the later required oxide layer 3) as shown in FIGS. 2 and 3.

According to FIG. 3, subsequently an oxide 3 of desired thickness b is deposited. Thickness b is somewhat greater than depth a. Oxide layer 3 may be in particular a CVD oxide.

Figure 4:
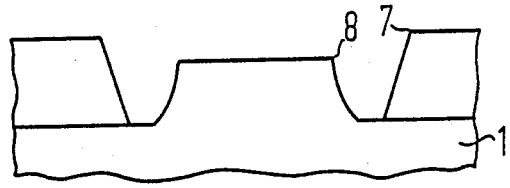

According to FIG. 4 in a second phototechnological step, the deposited oxide 3 with an area S2 greater than region S1 is etched. Due to the under cutting etching under protective layer 2 resulting in FIG. 2 and the inclined etching resulting in FIG. 4 the upper edge 7 of the oxide remaining according to FIG. 4 has from the upper edge 8 of the semiconductor surface a distance which corresponds approximately to thickness b of the deposited oxide 3.

Figure 5:
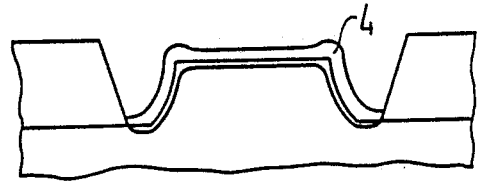

According to FIG. 5 a thermal oxidation takes place with growing of a thin hermetic oxide layer 4 of thickness c. Thickness c of the thermic oxide layer 4 is very much smaller than thickness b of the deposited oxide 3.

Figure 6:
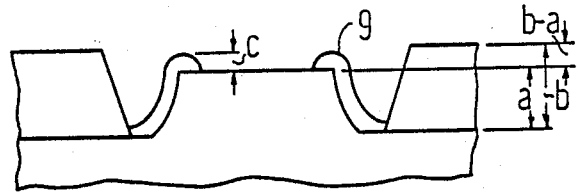

In accordance with FIG. 6, the hermetic oxide 4 is structured with the final base geometry S3. The thereby obtained basin depth of the base basin is equal to the thickness c of the hermetic oxide 4 given suitable choice of depth a and thickness c. If the thickness c of the hermetic oxide 4 is greater than the difference of thickness c of the deposited oxide 3 and depth a of the depression generated according to FIG. 2 then the upper edge 9 of the hermetic oxide 4 shown in FIG. 6 is the highest point of the overall arrangement according to FIGS. 5 and 6. If the upper edge 9 of the hermetic oxide 4 is the highest point, then image formation of fine structures is possible even with contact exposure. The difference in height between the upper edge 9 of the thermic oxide 4 and the upper edge 7 of the deposited oxide 3 can be small. Since the thickness c of the hermetic oxide 4 is small no short-circuit will occur in the region of the hermetic oxide 4 and yet no large capacitance in the region of the hermetic oxide 4 is present. Therefore, a method according to the invention permits large bonding pads with simultaneously small capacitance and with simultaneously thick oxide. A method according to the invention can proceed self-adjustingly.

Figure 7:
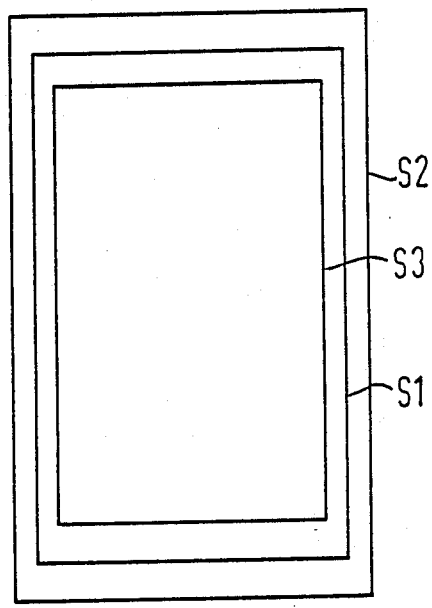
FIG. 7 explains in top view of the surface of the semiconductor transistor the utilized structures.

FIG. 7 provides a top view of the surface of a bipolar transistor in a method according to the invention. According to FIG. 1, a region S1 is covered with a protective layer 2. According to FIG. 4 with a second phototechnique step, the deposited oxide 3 is etched with a structure S2, which is larger than structure S1. According to FIG. 6 the hermetic oxide 4 is structured with the final base geometry (structure S3).

In conjunction with FIGS. 8 to 14, two improved methods for sinking a thick oxide 3 are demonstrated. For these two improved methods, first the method steps according to FIGS. 1 to 3 are performed. Carrying out the method according to FIGS. 8 to 14 utilizes a self-aligning process in order to keep the trench visible in FIG. 6 in the surface topology as small as possible. Over this trench, which is visible in FIG. 6, the connecting metallizations, for example with high-frequency transistors, must be carried. The deeper the trench in FIG. 6, the greater is the risk of thin places in the connecting metallization. In addition, the connecting metallizations produce in the region of the thin oxide 4 increased parasitic capacitances. Therefore, much is gained in keeping the region of the thin oxide 4 as narrow as possible.

Figure 1:
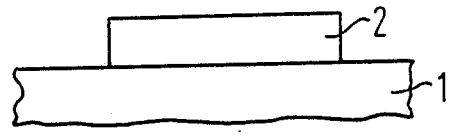
FIGS. 1 to 6 demonstrate a simple method for sinking a thick oxide.
Figure 8:
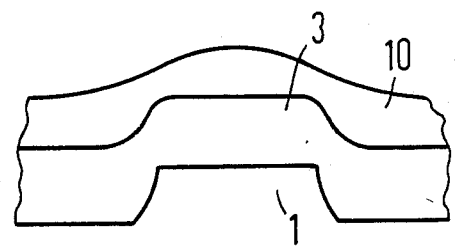
FIGS. 8 to 12 describe an improved method for sinking a thick oxide.

Building on the method steps according to FIGS. 1 to 3, in a first improved method the following additional process steps result:

According to FIG. 8, a lacquer layer 10 is applied on the surface of oxide 3. This lacquer layer 10 is made fluid by heating (heating depending on type of lacquer). A smoothed lacquer surface as shown in FIG. 8 is produced. At the edges of the mesa mountain 1 the lacquer layer 10 is thinner than above the planar area of the semiconductor surface.

Figure 9:
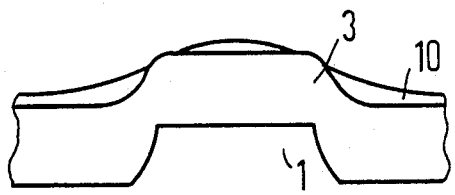

Therefore, directed back etching of the lacquer layer 10 first exposes the edges of the mesa mountain 1 (FIG. 9). This directed back etching of lacquer layer 10 can take place with oxygen RIE.

Figure 10:
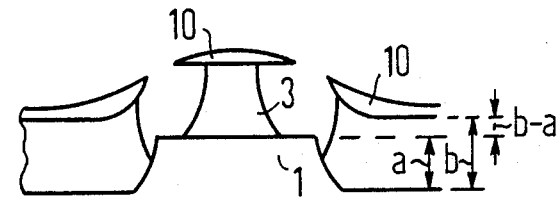

Subsequent etching of oxide 3 may be carried so far that the eges of the silicon mesa 1 are just exposed without the flanks of the silicon mesa 1 being entirely denuded in the process (FIG. 10). On the interior of the region of the silicon mesa 1, a portion of oxide 3 remains standing and must be removed in an additional photolithographic step.

For this additional photolithographic step, the lacquer layer 10 is completely removed. Subsequently, a thin oxide layer 11 is allowed to grow on. Finally, a further lacquer layer 12 is applied. This photoresist layer 12 is structured in the following photolithographic step. The precision of the alignment in this further photolithographic step must be sufficient that the contour of the structured photoresist 12 (FIGS. 11 and 13) falls into the region etched-free according to FIG. 10. The width of this etched-free region according to FIG. 10 around the silicon mesa 1 corresponds approximately to the two-fold thickness of oxide 3, specifically to a thickness of 2b.

Starting with the processing step of FIG. 10, two different paths may be taken. The first of these two steps is explained in conjunction with FIGS. 11 and 12, the second of these two steps is illustrated in greater detail in conjunction with FIGS. 13 and 14.

Figure 11:
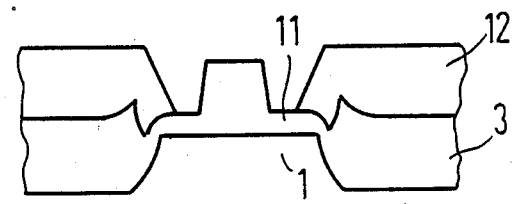
Figure 12:
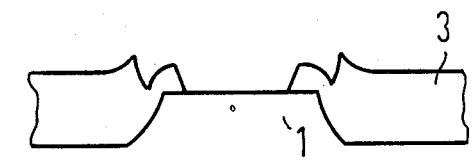

According to the processing steps in accordance with FIGS. 11 and 12, first the lacquer 10 is completely removed and the remaining semiconductor structural partially cleaned. Then the remaining semiconductor structural portion is again covered with a thin oxide 11. In this thin oxide 11 then the counter of the base is defined with the aid of the further aligned photolithography (photoresists 12) (FIG. 11) and etched free (FIG. 12).

Method steps according to FIGS. 11 and 12 are preferable if the base doping is to be introduced through the same window by means of implantation or diffusion only after carrying out the method steps according to FIGS. 11 and 12.

Figure 13:
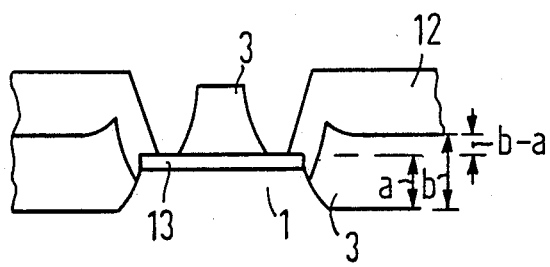
FIGS. 13 and 14 described a further improved method.
Figure 14:
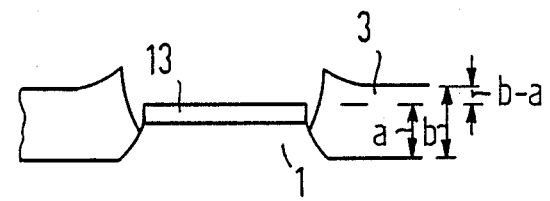

If base doping is already to be introduced earlier into the semiconductor surface 1 then, starting with FIG. 10, method steps according to FIGS. 13 and 14 are to be preferred to method steps according to FIGS. 11 and 12.

In the processing steps according to FIGS. 13 and 14, an additional oxide 11 is omitted. After removing the structured lacquer 10 (starting with FIG. 10), a further photoresist layer 12 is directly applied. The adjusted structuring of this photoresist layer 12 takes place corresponding to the aligned structuring of the photoresist layer 12 according to FIG. 11. On the interior of the mesa region a portion of oxide 3 likewise remains standing. This portion of oxide 3 remaining on the interior of the mesa region is, subsequently, etched away. The base surface inclusive of the pn-junctions 13 emerging at the edge of the mesa region consist then of uncovered silicon and must subsequently be covered with a dielectric of sufficient quality. The advantage of the process according to FIGS. 13 and 14 consists in that the countour of the photolithography carried out according to FIG. 13 disappears after removing resist 12 (FIG. 14).

There has thus been shown and described a novel process for a recessed oxide in bipolar transistors which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A method for generating a sunken oxide comprising the following steps:
   (a) covering a first region of a semiconductor surface with a protective layer which is greater than a subsequently desired non-oxidized region;
   (b) etching the area of the semiconductor surface not covered with the protective layer until a semiconductor mesa is formed which has nearly the height (b) of the subsequently desired oxide layer;
   (c) after removing the protective layer, depositing an oxide having a thickness (b) on the semiconductor surface in both the etched and non-etched areas;
   (d) in a photolithographic step etching the deposited oxide in a third region encompassing the first region and being larger than the first region;
   (e) thermally oxidizing the semiconductor surface to form a growth of a thermal oxide layer in the third region having a thickness (c) being small relative to the thickness (b) of the deposited oxide layer; and
   (f) etching the thermal oxide layer to form the desired non-oxidized region on the surface of the semiconductor mesa.

2. A method for generating a sunken oxide comprising the following steps:
 (a) covering a region of a semiconductor surface with a protective layer which is greater than a subsequently desired non-oxidized region;
 (b) etching the area of the semiconductor surface not covered with the protective layer until a semiconductor mesa is created which has nearly the height (b) of the desired oxide layer;
 (c) after removing of the protective layer, depositing an oxide of a desired thickness (b) onto the semiconductor surface in both the etched and non-etched areas to provide an oxide mesa;
 (d) applying a photoresistive layer on the oxide; making this photoresist layer fluid;
 (e) etching the photoresistive layer back until edges of the oxide mesa are exposed;
 (f) subsequently, etching the oxide until the edges of the semiconductor mesa are just exposed;
 (g) removing the photoresistive layer to cover the remaining semiconductor structural portion with a thin oxide; and
 (h) etching the thin oxide to form the desired non-oxidized region on the surface of the semiconductor mesa.

3. A method for producing a recessed oxide comprising the following steps:
 (a) covering a region of a semiconductor surface with a protective layer which is greater than the subsequently desired non-oxidized region;
 (b) etching the area of the semiconductor surface (a) not covered with the protective layer until a semiconductor mesa is formed which has nearly the height (b) of the later wanted oxide layer;
 (c) after removing of the protective layer, depositing an oxide of the wanted thickness (b) onto the semiconductor surface in both the etched and non-etched areas to provide an oxide mesa;
 (d) applying a photoresistive layer onto the oxide; making this photoresistive layer fluid;
 (e) etching the photoresistive layer back until mesa edges of the oxide mesa are exposed;
 (f) subsequently, etching the oxide until the mesa edges of the semiconductor mesa are just exposed; and
 (g) after removing the photoresistive layer by means of an aligned lithography step the inner region of the semiconductor mesa is exposed and etching the portion of oxide remaining there.

* * * * *

UNITED STATES PATENT AND TRADEMARK OFFICE
CERTIFICATE OF CORRECTION

PATENT NO. : 4,888,301

DATED : Dec. 19, 1989

INVENTOR(S) : Reichert et al.

It is certified that error appears in the above-identified patent and that said Letters Patent is hereby corrected as shown below:

Cover Page

Section [75] delete "Hansjöerg" and insert in its place --Hansjoerg--; and delete "Weidlcih" and insert in its place --Weidlich--.

Signed and Sealed this

Eleventh Day of December, 1990

Attest:

HARRY F. MANBECK, JR.

Attesting Officer

Commissioner of Patents and Trademarks